United States Patent
Jeon (10) Patent No.: US 10,656,209 B2
(45) Date of Patent: *May 19, 2020

(54) METHOD AND APPARATUS FOR MANAGING BATTERY

(71) Applicant: Samsung Electronics Co., Ltd., Suwon-si (KR)

(72) Inventor: Jinyong Jeon, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/583,455

(22) Filed: Sep. 26, 2019

(65) Prior Publication Data

US 2020/0025829 A1 Jan. 23, 2020

Related U.S. Application Data

(63) Continuation of application No. 15/584,820, filed on May 2, 2017, now Pat. No. 10,451,679, which is a continuation of application No. 14/570,477, filed on Dec. 15, 2014, now Pat. No. 9,660,462.

(30) Foreign Application Priority Data

May 30, 2014 (KR) ........................ 10-2014-0065961

(51) Int. Cl.
| | |
|---|---|
| *G01R 31/36* | (2020.01) |
| *H02J 7/00* | (2006.01) |
| *B60L 53/00* | (2019.01) |
| *B60L 3/00* | (2019.01) |

(52) U.S. Cl.
CPC .......... *G01R 31/3648* (2013.01); *B60L 53/00* (2019.02); *H02J 7/0016* (2013.01); *H02J 7/0021* (2013.01); *H02J 7/0029* (2013.01); *H02J 7/0031* (2013.01); *B60L 3/0084* (2013.01); *Y02T 10/7055* (2013.01)

(58) Field of Classification Search
CPC ... G01R 31/3648; B60L 53/00; B60L 3/0084; H02J 7/0031; H02J 7/0029; H02J 7/0016; H02J 7/0021; Y02T 10/7055
USPC .......................................................... 320/134
See application file for complete search history.

(56) References Cited

U.S. PATENT DOCUMENTS

| | | | | |
|---|---|---|---|---|
| 5,287,286 A | * | 2/1994 | Ninomiya | .......... G01R 31/3648 702/63 |
| 5,305,459 A | | 4/1994 | Rydel | |
| 5,422,558 A | * | 6/1995 | Stewart | ................. H01M 10/46 320/120 |

(Continued)

FOREIGN PATENT DOCUMENTS

| | | |
|---|---|---|
| EP | 0 616 281 A2 | 3/1994 |
| JP | 2003-224675 A | 8/2003 |

(Continued)

*Primary Examiner* — M Baye Diao
(74) *Attorney, Agent, or Firm* — NSIP Law (57) ABSTRACT

A battery managing apparatus includes a battery controller configured to determine a time when a battery enters a steady state based on a charge and discharge current of the battery. The apparatus further includes a time controller configured to wake up the battery controller based on the time when the battery enters the steady state. The battery controller is configured to control the battery in response to the time controller waking up the battery controller.

17 Claims, 5 Drawing Sheets

(56) References Cited

U.S. PATENT DOCUMENTS

| | | | |
|---|---|---|---|
| 5,423,045 A | 6/1995 | Kannan et al. | |
| 5,514,946 A | 5/1996 | Lin et al. | |
| 5,631,533 A * | 5/1997 | Imaseki | H02J 7/0016 320/118 |
| 5,633,573 A * | 5/1997 | van Phuoc | H02J 7/00 320/128 |
| 5,672,952 A * | 9/1997 | Szepesi | H02J 7/0031 320/164 |
| 5,821,734 A * | 10/1998 | Faulk | H02J 2207/20 320/124 |
| 5,936,317 A * | 8/1999 | Sasanouchi | H02J 7/0031 307/10.1 |
| 6,124,701 A * | 9/2000 | McDowell | G01R 31/3648 320/132 |
| 6,178,516 B1 * | 1/2001 | Meade | G06F 1/24 713/300 |
| 6,215,281 B1 * | 4/2001 | Koch | H02J 7/0014 320/150 |
| 6,841,972 B2 * | 1/2005 | Koo | B60K 6/46 320/132 |
| 7,078,878 B2 * | 7/2006 | Koo | G01R 31/386 320/132 |
| 7,131,011 B2 * | 10/2006 | Westerinen | G06F 1/30 713/300 |
| 7,263,416 B2 | 8/2007 | Sakurai et al. | |
| 7,593,823 B2 * | 9/2009 | Iwane | G01R 31/392 702/63 |
| 7,633,264 B2 | 12/2009 | Fukuzawa et al. | |
| 7,791,314 B2 | 9/2010 | Bucur et al. | |
| 8,129,951 B2 * | 3/2012 | Turner | B60L 50/66 320/134 |
| 8,154,255 B2 | 4/2012 | Wang et al. | |
| 8,159,092 B2 | 4/2012 | Luthi et al. | |
| 8,193,763 B2 * | 6/2012 | Kawata | H01M 10/425 320/107 |
| 8,237,561 B2 * | 8/2012 | Beigel | H01Q 1/2225 340/572.1 |
| 8,417,977 B2 | 4/2013 | Chuang et al. | |
| 8,431,263 B2 | 4/2013 | Shuster | |
| 8,447,544 B2 * | 5/2013 | Hsu | G01R 31/367 702/63 |
| 8,533,509 B2 | 9/2013 | Kamijima | |
| 8,669,741 B2 | 3/2014 | Seo et al. | |
| 8,754,611 B2 * | 6/2014 | Greening | H02J 7/0072 320/112 |
| 8,779,729 B2 * | 7/2014 | Shiraishi | G06F 1/3212 320/155 |
| 9,142,980 B2 | 9/2015 | Lee | |
| 9,225,185 B2 | 12/2015 | Ham | |
| 9,287,728 B2 | 3/2016 | Odaohhara et al. | |
| 9,673,640 B2 | 6/2017 | Kudo et al. | |
| 9,685,807 B2 | 6/2017 | Nakao et al. | |
| 9,952,288 B2 * | 4/2018 | Nakao | G01R 31/3648 |
| 2006/0091862 A1 * | 5/2006 | Melichar | G01R 31/3648 320/132 |
| 2011/0078092 A1 * | 3/2011 | Kim | B60L 50/66 705/412 |
| 2011/0248675 A1 | 10/2011 | Shiu et al. | |
| 2012/0072144 A1 * | 3/2012 | Zhang | G01R 31/3828 702/63 |
| 2012/0072146 A1 * | 3/2012 | Hsu | G01R 31/367 702/63 |
| 2012/0131367 A1 | 5/2012 | Kamijima | |
| 2012/0143585 A1 * | 6/2012 | Barsukov | G01R 31/367 703/18 |
| 2012/0181987 A1 | 7/2012 | Lee et al. | |
| 2012/0293131 A1 * | 11/2012 | Nakamura | G01R 31/3828 320/134 |
| 2013/0099757 A1 | 4/2013 | Ham | |
| 2013/0113280 A1 * | 5/2013 | Yang | H02J 7/0016 307/19 |
| 2013/0187610 A1 | 7/2013 | Hayashi et al. | |
| 2014/0079969 A1 * | 3/2014 | Greening | H01M 10/48 429/91 |
| 2014/0175873 A1 * | 6/2014 | Kishimoto | H01M 10/441 307/10.1 |
| 2014/0306666 A1 * | 10/2014 | Choi | H02J 7/0016 320/134 |
| 2015/0108991 A1 * | 4/2015 | Aoshima | G01R 31/3648 324/430 |
| 2015/0301121 A1 * | 10/2015 | Park | G01R 31/392 324/430 |
| 2015/0309118 A1 | 10/2015 | Jeon | |
| 2016/0064776 A1 * | 3/2016 | Ro | H01M 10/48 429/61 |
| 2016/0152153 A1 | 6/2016 | Yang et al. | |
| 2016/0161367 A1 * | 6/2016 | Chu | G01M 15/02 324/433 |

FOREIGN PATENT DOCUMENTS

| | | |
|---|---|---|
| JP | 2006-53026 A | 2/2006 |
| JP | 2007-311256 A | 11/2007 |
| JP | 2012-138979 A | 7/2012 |
| KR | 10-2009-0073811 A | 7/2009 |
| KR | 10-2012-0013775 A | 2/2012 |
| KR | 10-2013-0100523 A | 9/2013 |

\* cited by examiner

METHOD AND APPARATUS FOR MANAGING BATTERY

CROSS-REFERENCE TO RELATED APPLICATION

This application is a continuation application of U.S. patent application Ser. No. 15/584,820 filed on May 2, 2017 which is a continuation application of U.S. patent application Ser. No. 14/570,477, now U.S. Pat. No. 9,660,462, filed on Dec. 15, 2014, which claims the benefit under 35 USC 119(a) of Korean Patent Application No. 10-2014-0065961, filed on May 30, 2014, in the Korean Intellectual Property Office, the entire disclosures of each of which are incorporated herein by reference for all purposes.

BACKGROUND

1. Field

The following description relates to a method and an apparatus for managing a battery.

2. Description of Related Art

Electric vehicles are garnering substantial attention as a future means of transportation while issues related to environment and energy resources are becoming more prominent. An electric vehicle uses, as a main power source, a battery in which chargeable and dischargeable secondary cells form a pack, and thus, emits no exhaust, and an associated amount of noise is to a large extent reduced.

The battery for the electric vehicle may function as an engine and a fuel tank of a gasoline-powered vehicle. Thus, the battery may need to be managed more accurately and effectively. Accordingly, research on a method of verifying a state of the battery more accurately and increasing efficiency of the electric vehicle is ongoing.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a battery managing apparatus, including a battery controller configured to determine a time when a battery enters a steady state based on a charge and discharge current of the battery, and a time controller configured to wake up the battery controller based on the time when the battery enters the steady state. The battery controller is further configured to control the battery in response to the time controller waking up the battery controller.

The battery controller may be further configured to measure the charge and discharge current of the battery at a time when a switch of the charge and discharge circuit is turned off or immediately prior to the switch being turned off.

The battery controller may be configured to determine the time when the battery enters the steady state by comparing the charge and discharge current to predetermined reference information.

The apparatus may further include a driving power supplier configured to supply driving power to the battery controller. The time controller may be configured to wake up the battery controller by transmitting a wakeup signal to the driving power supplier.

The driving power supplier may be configured to supply the driving power to the battery controller in response to receiving the wakeup signal.

The battery controller may be further configured to set a wakeup cycle based on the time when the battery enters the steady state. The time controller may be configured to wake up the battery controller based on the wakeup cycle.

The apparatus may further include a balancing unit configured to measure voltages of cells included in the battery, and perform balancing on the cells.

The battery controller may be further configured to calculate a voltage deviation between the cells based on the voltages, and control the balancing unit to perform the balancing on the cells.

The balancing unit may include resistors connected respectively to the cells, and the battery controller may be further configured to control the balancing unit to apply power of remaining cells, excluding a cell having a lowest voltage among the cells, to resistors connected respectively to the remaining cells to allow respective voltages of the remaining cells to be a voltage of the cell having the lowest voltage.

The balancing unit may include a temperature measurer configured to measure a temperature of the resistors, and the battery controller may be further configured to control the balancing unit to perform the balancing on the cells.

The battery controller may be further configured to detect a state of charge of the battery in response to the time controller waking up the battery controller.

The apparatus may further include a voltage measurer configured to measure an open circuit voltage of the battery. The battery controller may be configured to detect the state of charge of the battery based on the measured open circuit voltage.

The battery controller may be further configured to detect a state of health of the battery in response to the time controller waking up the battery controller.

The apparatus may further include a resistance measurer configured to measure an internal resistance of the battery. The battery controller may be configured to detect the state of health of the battery based on the measured internal resistance.

The battery controller may be further configured to store information of the control of the battery.

In still another general aspect, there is provided an operating method of a battery managing apparatus, the method including determining a time when a battery enters a steady state based on a charge and discharge current of the battery, setting a period of time during which the battery managing apparatus is woken up based on the time when the battery enters the steady state, and controlling the battery in response to the battery managing apparatus being woken up.

The method may further include measuring the charge and discharge current of the battery at a time when a switch of the charge and discharge circuit is turned off or immediately prior to the switch being turned off.

The controlling may include measuring voltages of cells included in the battery, and performing balancing on the cells based on the measured voltages.

The controlling may include measuring an open circuit voltage of the battery, and detecting a state of charge of the battery based on the measured open circuit voltage.

The controlling may include measuring an internal resistance of the battery, and detecting a state of health of the battery based on the measured internal resistance.

Other features and aspects will be apparent from the following detailed description, the drawings, and the claims.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Figure 1:
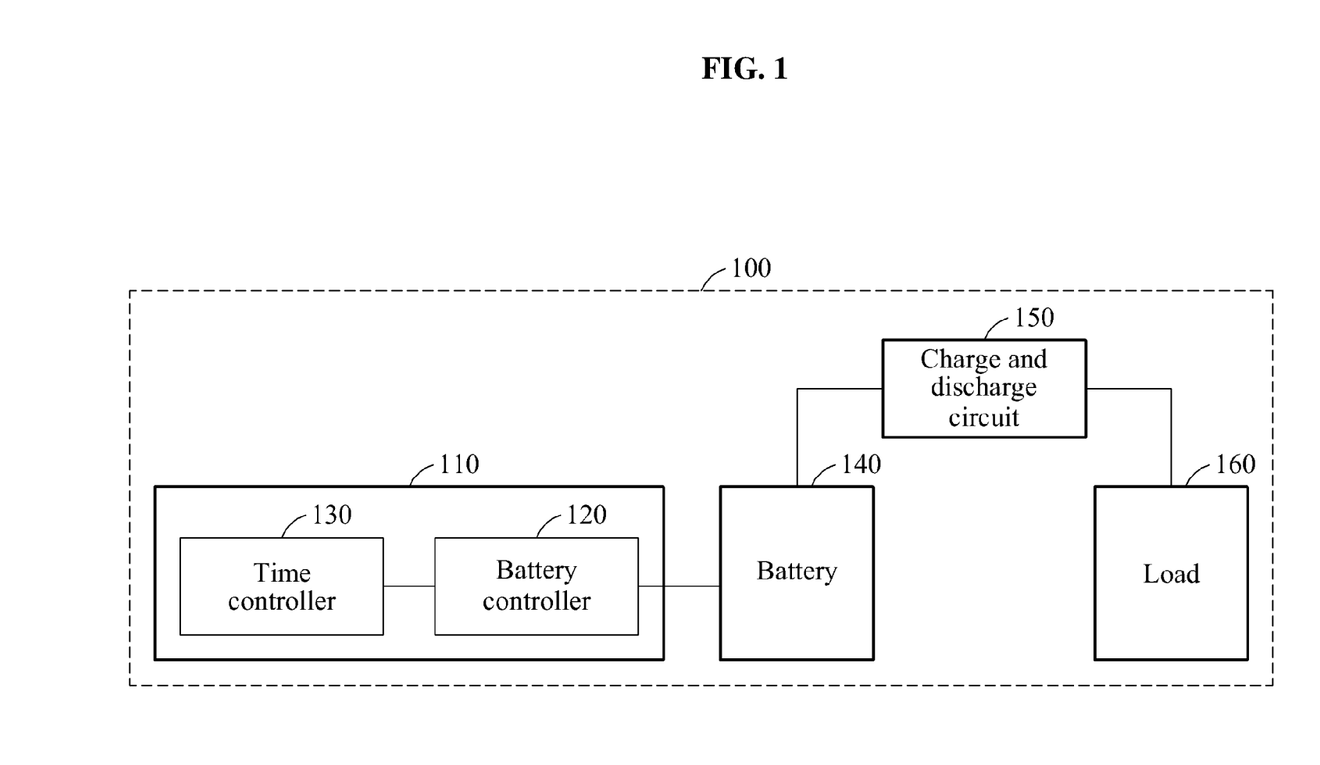
FIG. 1 is a block diagram illustrating an example of a battery managing apparatus.

FIG. 1 is a block diagram illustrating an example of a battery managing apparatus 110. Referring to FIG. 1, a battery system 100 includes the battery managing apparatus 110, a battery 140, a charge and discharge circuit 150, and a load 160.

The battery managing apparatus 110 includes a battery controller 120 and a time controller 130. The battery managing apparatus 110 controls the battery 140. The battery 140 may supply power to a driving means, for example, an electric vehicle and an electric bicycle, to which the battery 140 is provided, and include battery modules. A battery module may include cells. A cell may be a secondary cell such as a lithium-ion battery. Capacities or voltages of the cells may be identical or different.

The battery managing apparatus 110 monitors a state of the battery 140, and controls the battery 140 based on the monitored state. The battery managing apparatus 110 may refer to a battery management system (BMS).

The battery managing apparatus 110 may control heat of the battery modules included in the battery 140. The battery managing apparatus 110 may prevent overcharging and over-discharging of the battery modules, and control charge states of the battery modules to be equivalent. Thus, an energy efficiency of the battery modules may increase, and a lifespan of the battery modules may be prolonged.

Also, the battery managing apparatus 110 may detect a state of health (SoH), a state of charge (SoC), and a state of function (SoF) of the battery 140. The SoH may indicate a degree of deterioration in performance of the battery 140 compared to a state at a time of manufacturing. The SoC of the battery 140 may indicate information of an amount of charge received by the battery 140, and the SoF may indicate information as to whether the performance of the battery 140 satisfies a predetermined condition.

The battery managing apparatus 110 may provide, to an electronic control unit (ECU), health information, charge information, and function information of the battery 140. The battery managing apparatus 110 may communicate with the ECU, using controller area network (CAN) communication.

The battery controller 120 controls the battery managing apparatus 110. The battery controller 120 may include a micro control unit (MCU), and control other units included in the battery managing apparatus 110.

The battery 140 is connected to the charge and discharge circuit 150, and charging and discharging of the battery 140 is controlled by a switching operation of the charge and discharge circuit 150. For example, when an ignition key of a driving means is turned on, a switch of the charge and discharge circuit 150 may be turned on. Accordingly, the battery 140 may be connected to the load 160 or an external power source (not shown), and thus, the charging and discharging of the battery 140 may be performed. Also, the battery controller 120 may be driven to monitor a state of the battery 140, and control the battery 140. Conversely, when the ignition key of the driving means is turned off, the switch of the charge and discharge circuit 150 may be turned off. Accordingly, the battery 140 may be disconnected from the load 160 or the external power source, and thus, the charging and discharging of the battery 140 may be suspended. Also, an operation of the battery controller 120 may be suspended.

When the switch of the charge and discharge circuit 150 connected to the battery 140 is turned off, an operating mode of the battery controller 120 may enter a sleep mode. The operating mode may include a general mode, the sleep mode, and a wakeup mode. The general mode may indicate a mode in which the battery controller 120 controls the battery 140 when the switch of the charge and discharge circuit 150 is turned on. The sleep mode may indicate a mode in which the battery controller 120 enters an idle state when the switch of the charge and discharge circuit 150 is turned off. The wakeup mode may indicate a mode in which the battery controller 120 temporarily controls the battery 140 during the switch of the charge and discharge circuit 150 being turned off. The wakeup mode may operate with a lower amount of power in comparison to the general mode.

The battery controller 120 may measure an amount of charge and discharge current of the battery 140, using a current measurer (not shown), when the switch of the charge and discharge circuit 150 is turned off or immediately prior to the switch being turned off. The current measurer may be included in the battery 140 or in the battery managing apparatus 110. For example, when the switch of the charge and discharge circuit 150 is turned off, the battery 140 may suspend the charging and discharging simultaneously, and the operation of the battery controller 120 may be suspended after a predetermined amount of time elapses after the charging and discharging of the battery 140 is suspended. The battery controller 120 may measure the amount of the charge and discharge current of the battery 140 when the switch of the charge and discharge circuit is turned off. Also, the battery controller 120 may constantly monitor the amount of the charge and discharge current of the battery 140 while the switch of the charge and discharge circuit 150 is in an on state. The battery controller 120 may detect the switch of the charge and discharge circuit 150 being turned off, and extract an amount of current charged and discharged to the battery 140 immediately prior to the switch of the charge and discharge circuit 150 being turned off.

The battery controller 120 determines a point in time at which the battery 140 enters a steady state, using the measured amount of the charge and discharge current of the battery 140. The steady state indicates a state in which the battery 140 is electrically stable. When the switch of the charge and discharge circuit 150 is turned off and the charging and the discharging of the battery 140 is suspended, the battery 140 may be electrically unstable for a predetermined amount of time, and become electrically stable to enter the steady state after a predetermined amount of time elapses. The point in time at which the battery 140 enters the steady state may vary based on an amount of charge and discharge current measured immediately before the charging and discharging of the battery 140 is suspended. For example, a greater amount of time may be used for the battery 140 to enter the steady state when the amount of charge and discharge current is large than when the amount of charge and discharge current is small.

Also, the battery controller 120 may obtain the point in time at which the battery 140 enters the steady state by comparing the amount of charge and discharge current of the battery 140 to predetermined reference information. The predetermined reference information may indicate information of a point in time at which the battery 140 enters the steady state based on an amount of charge and discharge current of the battery 140, and be calculated in advance and stored in the battery controller 120. The predetermined reference information may include a lookup table storing the information of the point in time at which the battery 140 enters the steady state, which is to be mapped to the amount of charge and discharge current. Accordingly, the battery controller 120 may measure the amount of charge and discharge current of the battery 140 at a point in time when the switch of the charge and discharge circuit 150 is turned off or immediately prior to the switch being turned off, search the lookup take, extract a point in time mapped to the measured amount of the charge and discharge current, and determine the extracted point in time as the point in time at which the battery 140 enters the steady state.

The time controller 130 may include a real time clock (RTC). The time controller 130 may measure or maintain time, and normally operate despite the switch of the charge and discharge circuit 150 being turned off.

The time controller 130 may wake up the battery controller 120 based on the point in time at which the battery 140 enters the steady state. The waking up may indicate an operation to switch the operating mode of the battery controller 120 from the sleep mode to the wakeup mode.

The battery managing apparatus 110 may include a driving power supplier (not shown). The driving power supplier may supply driving power to the battery controller 120. For example, the driving power supplier may include a voltage regulator, and supply the driving power to the battery controller 120 by converting a voltage provided from an external power source to a voltage to be input to the battery controller 120. The time controller 130 may transmit a wakeup signal to the driving power supplier. The driving power supplier may supply the driving power to the battery controller 120 in response to the wakeup signal.

The time controller 130 may wake up the battery controller 120 based on a wakeup cycle. The time controller 130 may transmit the wakeup signal to the driving power supplier based on the wakeup cycle. The driving power supplier may transmit the driving power to the battery controller 120 when the wakeup signal is being received. Also, the driving power supplier may not transmit the driving power to the battery controller 120 when the wakeup signal is not being received.

The battery controller 120 may set the wakeup cycle based on the point in time at which the battery 140 enters the steady state. For example, when an amount of time used for the battery 140 to enter the steady state is set to be five minutes, the battery controller 120 may determine the wakeup cycle to be five minutes, and input the determined wakeup cycle to the time controller 120.

When the time controller 130 wakes up the battery controller 120, the operating mode of the battery controller 120 may be converted to the wakeup mode, and the battery controller 120 may control the battery 140 during the wakeup mode. When the charging and discharging of the battery 140 is suspended, the battery 140 may be in a no-load state. When the battery 140 enters the steady state, the battery 140 may become electrically stable. When the battery 140 is electrically stable, a state of the battery 140 may be accurately detected. Accordingly, the battery controller 120 may optimize or monitor the state of the battery 140 in the wakeup mode.

The battery controller 120 may perform balancing on the cells included in the battery 140 in the wakeup mode. When charging and discharging is performed repeatedly on the cells, a voltage deviation may occur between the cells. When the voltage deviation occurs, overcharging or over-discharging of a cell may occur. When the overcharging or over-discharging occurs, a capacity of the battery 140 may be reduced, and a lifespan of the battery 140 may be curtailed. Accordingly, to maintain the voltage deviation between the cells to be constant, the battery controller 120 may perform the balancing on the cells. When the battery 140 is not electrically stable, voltages of the cells included in the battery 140 may not be accurately measured, and thus, precise balancing may not be performed. Thus, the battery controller 120 may perform the balancing on the cells in the wakeup mode in which the battery 140 enters the steady state. Also, the battery controller 120 may perform the balancing on the cells based on the wakeup cycle. For example, when the wakeup cycle is set to be five minutes, the operating mode of the battery controller 120 may alternate between the wakeup mode and the sleep mode every five minutes. When a period of 50 minutes is needed to perform the balancing on the cells, the battery controller 120 may repeat, 10 times, operations of performing the balancing on the cells in the wakeup mode and suspending the balancing on the cells in the sleep mode.

The battery controller 120 may detect the SoC or the SoH of the battery 140 in the wakeup mode. The battery controller 120 may measure an open circuit voltage of the battery 140 to detect the SoC of the battery 140, and measure an internal resistance of the battery 140 to detect the SoH. When the battery controller 120 is in the wakeup mode, the battery 140 may be in the steady state. Accordingly, the open circuit voltage or the internal resistance of the battery 140 may be more accurately measured in the wakeup mode than when the charging and discharging of the battery 140 is performed. The battery controller 120 may detect the SoC or the SoH of the battery 140, using the predetermined reference information. For example, the battery controller 120 may include a lookup table in which information of the SoC of the battery 140 based on the open circuit voltage of the battery 140 is stored. The SoC of the battery 140 may vary based on the open circuit voltage of the battery 140. The SoC of the battery 140 based on the open circuit voltage of the battery 140 may be calculated in advance and stored in the lookup table. The battery controller 120 may extract state information mapped to the measured open circuit voltage by searching the lookup table, and determine the extracted state information to be the SoC of the battery 140.

For another example, the battery controller 120 may include a lookup table in which information of the SoH of the battery 140 based on the internal resistance of the battery 140 is stored. The SoH of the battery 140 based on the internal resistance of the battery 140 may be calculated in advance and stored in the lookup table. The battery controller 120 may extract lifespan information mapped to the measured internal resistance by searching the lookup table, and determine the extracted lifespan information to be the SoH of the battery 140.

The SoC or the SoH of the battery 140 detected after the battery 140 enters the steady state may be more accurate than the SoC or the SoH of the battery 140 detected during charging or discharging. Accordingly, the battery controller 120 may update information of the SoC or the SoH of the battery 140 detected during charging or discharging to be information detected after the battery 140 enters the steady state.

In the wakeup mode, the battery controller 120 may extract other state information of the battery 140, in addition to the SoC and SoH of the battery 140. For example, the battery controller 120 may extract a travelable distance of the driving means to which the battery 140 is provided, using the SoC and the SoH of the battery 140 and predetermined information, for example, road information.

Figure 2:
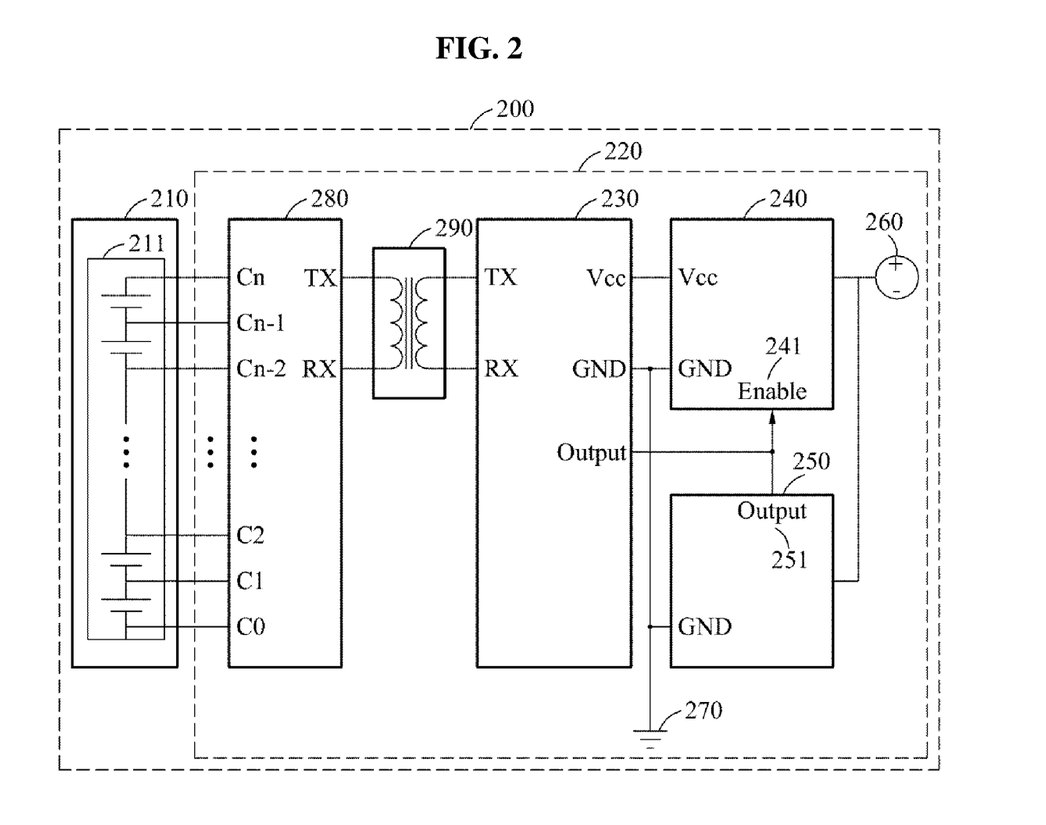
FIG. 2 is a diagram illustrating an example of a battery system.

FIG. 2 is a diagram illustrating an example of a battery system 200. Referring to FIG. 2, the battery system 200 includes a battery pack 210 and a battery managing apparatus 220.

The battery pack 210 includes at least one battery module. As illustrated in FIG. 2, the battery pack 210 includes a single battery module 211 for convenience of description, but is not limited thereto. The battery module 211 includes cells. The cells are connected in series.

The battery pack 210 may be connected to a charge and discharge circuit (not shown), and charging and discharging of the battery pack 210 may be controlled by a switching operation of the charge and discharge circuit. For example, when an ignition key of a driving means to which the battery system 200 is provided is turned on, a switch of the charge and discharge circuit may be turned on, and the charging and discharging of the battery pack 210 may be performed. Conversely, when the ignition key of the driving means is turned off, the switch of the charge and discharge circuit may be turned off, and accordingly, the charging and discharging of the battery pack 210 may be suspended.

The battery managing apparatus 220 includes a battery controller 230, a driving voltage supplier 240, a time controller 250, a balancing unit 280, and an insulating unit 290. The driving voltage supplier 240 may be also referred to as a driving power supplier described herein. The battery controller 230, the driving voltage supplier 240, and the time controller 250 are grounded to a ground 270.

The battery controller 230 controls the battery managing apparatus 220, and an operation of the battery controller 230 may be controlled based on the switching operation of the charge and discharge circuit. For example, when the switch of the charge and discharge circuit is in an on state, the battery controller 230 may operate. When the switch of the charge and discharge circuit is in an off state, the operation of the battery controller 230 may be suspended.

When the switch of the charge and discharge circuit is turned off and the operation of the battery controller 230 is suspended, the time controller 250 may wake up the battery controller 230, using the driving voltage supplier 240. The time controller 250 may measure or maintain time, and normally operate despite the switch of the charge and discharge circuit being turned off. The battery controller 230 may measure an amount of charge and discharge current of the battery pack 210, using a current measurer (not shown), when the switch of the charge and discharge circuit is turned off or immediately prior to the switch being turned off. The battery controller 230 may calculate a point in time at which the battery pack 210 enters a steady state, using the measured amount of charge and discharge current of the battery pack 210. The battery controller 230 may set a wakeup cycle based on the point in time at which the battery pack 210 enters the steady state. The battery controller 230 may input the set wakeup cycle to the time controller 250.

The time controller 250 may transmit a wakeup signal to the driving voltage supplier 240 based on the wakeup cycle. The driving voltage supplier 240 may include a voltage regulator (not shown). For example, the time controller 250 may transmit the wakeup signal to the driving voltage supplier 240, using an output pin 251 based on the wakeup cycle, and an enable pin 241 of the driving voltage supplier 240 may be in an on state due to the wakeup signal. When the enable pin 241 is in the on state, the driving voltage supplier 240 may adjust a voltage provided from an external power source 260, for example, a lead storage battery, to be suitable for the battery controller 230, and provide the adjusted voltage to the battery controller 230. For example, when external power is a direct current (DC) power with 12 volts (V), and a voltage Vcc of driving power that may be input to the battery controller 230 is less than or equal to 5 V, the driving voltage supplier 240 may drop a voltage of the external power from 12 V to 5 V, and supply the driving power with the voltage Vcc of 5 V to the battery controller 230.

The battery controller 230 may operate during the driving power being supplied from the driving voltage supplier 240. When the battery controller 230 is not provided with the driving power from the driving voltage supplier 240, the operation of the battery controller 230 may be suspended. For example, when the wakeup cycle is set to be three minutes, the battery controller 230 may receive the driving power from the driving power supplier 240 at an interval of three minutes. Thus, the battery controller 230 may alternate between the operation and the suspension of the operation at three minute intervals.

The battery controller 230 may control a battery while the battery controller 230 is being woken up. In detail, the battery controller 230 controls the balancing unit 280 to perform balancing on the cells included in the battery pack 210. The balancing unit 280 measures voltages of the cells, and perform the balancing on the cells based on the measured voltages. The balancing unit 280 may include an integrated circuit (IC) that measures a voltage of a cell.

When the battery pack 210 is not electrically stable, the voltages of the cells included in the battery pack 210 may not be accurately measured, and thus, precise balancing may not be performed on the cells. Thus, the balancing unit 280 may perform the balancing on the cells after the battery pack 210 enters the steady state.

For example, voltage ports C0 to Cn of the balancing unit 280 may be connected to cells included in the balancing unit 280. The balancing unit 280 may measure the voltages of the cells by receiving a voltage of each cell through the voltage ports. The balancing unit 280 may perform the balancing on the cells based on a voltage of a cell having a lowest voltage among the cells. For example, each cell may be connected to a resistor. The balancing unit 280 may apply electrical energy of remaining cells, excluding the cell having the lowest voltage among the cells, to a resistor connected to each of the remaining cells to allow respective voltages of the remaining cells to be the voltage of the cell having the lowest voltage among the cells. Accordingly, the voltages of the cells may be identical to the voltage of the cell having the lowest voltage among the cells.

The battery controller 230 transmits a control signal to the balancing unit 280. The balancing unit 280 measures the voltages of the cells based on the control signal, and transmits, to the battery controller 230, information of the measured voltages of the cells. The balancing unit 280 may be connected to the battery pack 210 to be a high voltage, and the battery controller 230 may be a low voltage. When the balancing unit 280 transmits, to the battery controller 230, the information of the voltages of the cells, an error of transmission of the information may occur. For example, when the balancing unit 280 and the battery controller 230 are not electrically separated, and the balancing unit 280 transmits data including the information of the voltages of the cells to the battery controller 230, an electrical potential of a ground (not shown) to which the battery pack 210 is grounded may fluctuate. When the electrical potential of the ground to which the battery pack 210 is grounded fluctuates, the error may occur in the data to be transmitted from the balancing unit 280, and thus, the battery controller 230 may not obtain the information of the voltages of the cells. Thus, the insulating unit 290 is connected between the balancing unit 280 and the battery controller 230 to electrically separate the balancing unit 280 and the battery controller 230. When the balancing unit 280 and the battery controller 230 are electrically separated by the insulating unit 290, the balancing unit 280 may transmit the information of the voltages of the cells to the battery controller 230.

The battery controller 230 may determine whether to perform the balancing on the cells, using a voltage deviation between the cells. The battery controller 230 may calculate the voltage deviation between the cells using the measured voltages of the cells. When the voltage deviation between the cells is greater than a predetermined threshold voltage, the battery controller 230 may control the balancing unit 280 to perform the balancing on the cells. When the voltage deviation between the cells is less than or equal to the predetermined threshold voltage, the battery controller 230 may control the balancing unit 280 not to perform the balancing on the cells.

The battery controller 230 may determine whether to perform the balancing on the cells, using a temperature of resistors connected respectively to the cells. When the balancing is performed, heat may be generated in a resistor to which electrical energy is applied. When an excessive amount of the heat is generated in the resistor, performance of the resistor may be reduced. The balancing unit 280 may include a temperature measurer (not shown) to measure the temperature of the resistors. The balancing unit 280 may measure the temperature of the resistors connected respectively to the cells, using the temperature measurer. When the temperature of the resistors is less than a predetermined threshold temperature, the battery controller 230 may control the balancing unit 280 to perform the balancing on the cells. When the temperature of the resistors is greater than or equal to the predetermined threshold temperature, the battery controller 230 may control the balancing unit 280 to suspend the balancing on the cells. The battery controller 230 may perform the balancing on the cells based on the wakeup cycle.

The battery controller 230 may measure an open circuit voltage of the battery pack 210, using a voltage measurer (not shown), and detect an SoC of the battery pack 210 based on the measured open circuit voltage of the battery pack 210. Also, the battery controller 230 may measure an internal resistance of the battery pack 210, using a resistance measurer (not shown), and detect an SoH of the battery pack 210 based on the measured internal resistance of the battery pack 210.

Figure 3:
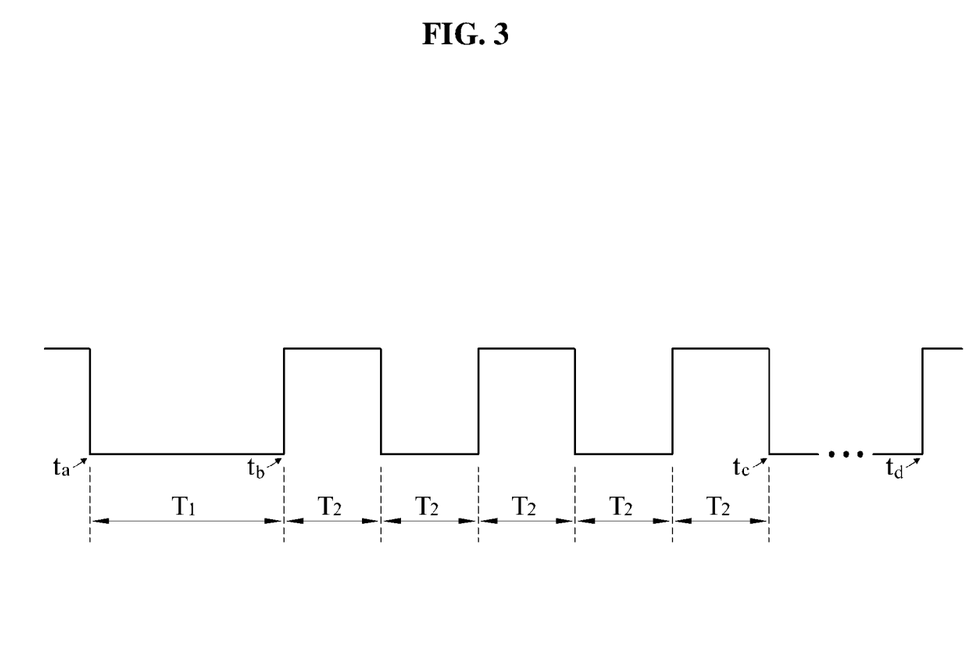
FIG. 3 is a diagram illustrating an example of a wakeup cycle.

FIG. 3 is a diagram illustrating an example of a wakeup cycle. Referring to FIG. 3, a battery managing apparatus may include a battery controller and a time controller, and control a battery. The battery may be connected to a charge and discharge circuit, and charging and discharging of the battery may be controlled based on a switching operation of the charge and discharge circuit. At a point in time "$t_a$", an ignition key of a driving means to which the battery is provided may be turned off, and a switch of the charge and discharge circuit may be turned off. Accordingly, the charging and discharging of the battery may be suspended, and an operation of the battery controller may be suspended. At $t_a$, the battery controller may measure an amount of charge and discharge current of the battery, and calculate a period of time during which the battery enters a steady state, using the measured amount of charge and discharge current. The battery controller may set a wakeup cycle based on the period of time during which the battery enters the steady state. For example, the battery controller may calculate a period of time "$T_1$" during which the battery enters the steady state, and calculate a wakeup cycle "$T_2$" based on a predetermined rule. The battery controller may input the set wakeup cycle to the time controller. After $T_1$ elapses from $t_a$, at a point in time "$t_b$," the time controller may wake up the battery controller at an interval of $T_2$. When the waking up is performed, the battery controller may control the battery. For example, during the battery controller being woken up, the battery controller may perform the balancing on cells included in the battery, and detect an SoC or SoH of the battery. At a point in time "$t_c$", the battery controller may complete the balancing performed on the cells or detection of a state of the battery. The battery controller may transmit a wakeup end signal to the time controller, and the time controller may suspend the waking up in response to the wakeup end signal. At a point in time "$t_d$", the ignition key of the driving means may be turned on, and accordingly, the battery may perform the charging and discharging, and the batter controller may operate.

Figure 4:
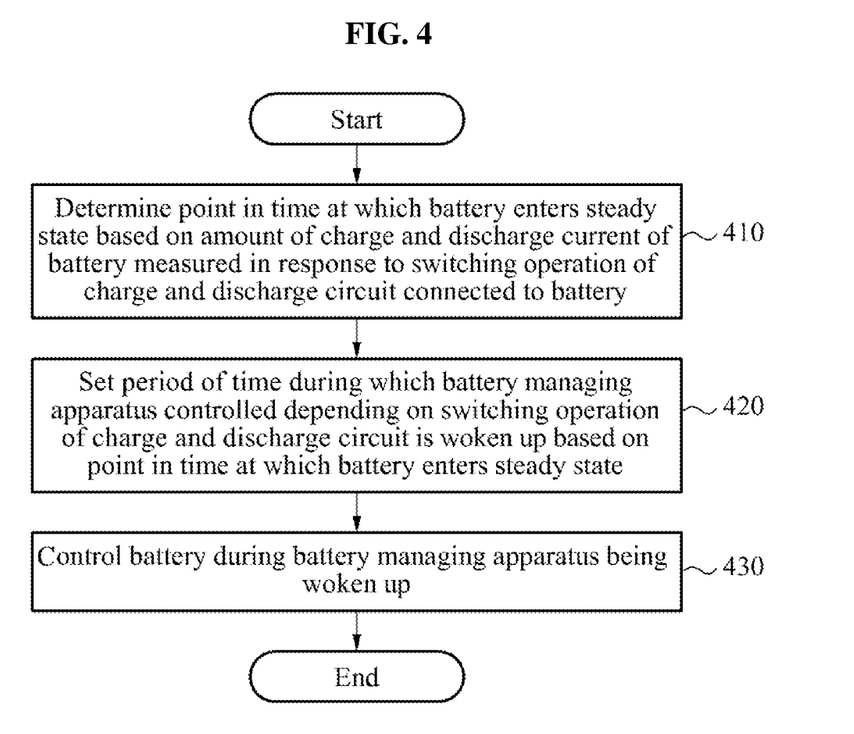
FIG. 4 is a flowchart illustrating an example of an operating method of a battery managing apparatus.

FIG. 4 is a flowchart illustrating an example of an operating method of a battery managing apparatus. Referring to FIG. 4, in operation 410, the battery managing apparatus determines a point in time at which a battery enters a steady state based on an amount of charge and discharge current of the battery measured in response to a switching operation of a charge and discharge circuit connected to the battery.

In operation 420, the battery managing apparatus sets a period of time during which the battery managing apparatus is woken up based on the point in time at which the battery enters the steady state. The operation of the battery managing apparatus is controlled based on the switching operation of the charge and discharge circuit.

In operation 430, the battery managing apparatus controls the battery during the battery managing apparatus being woken up.

Descriptions provided with reference to FIGS. 1 through 3 may be applicable hereto, and thus, repeated descriptions will be omitted for conciseness.

Figure 5:
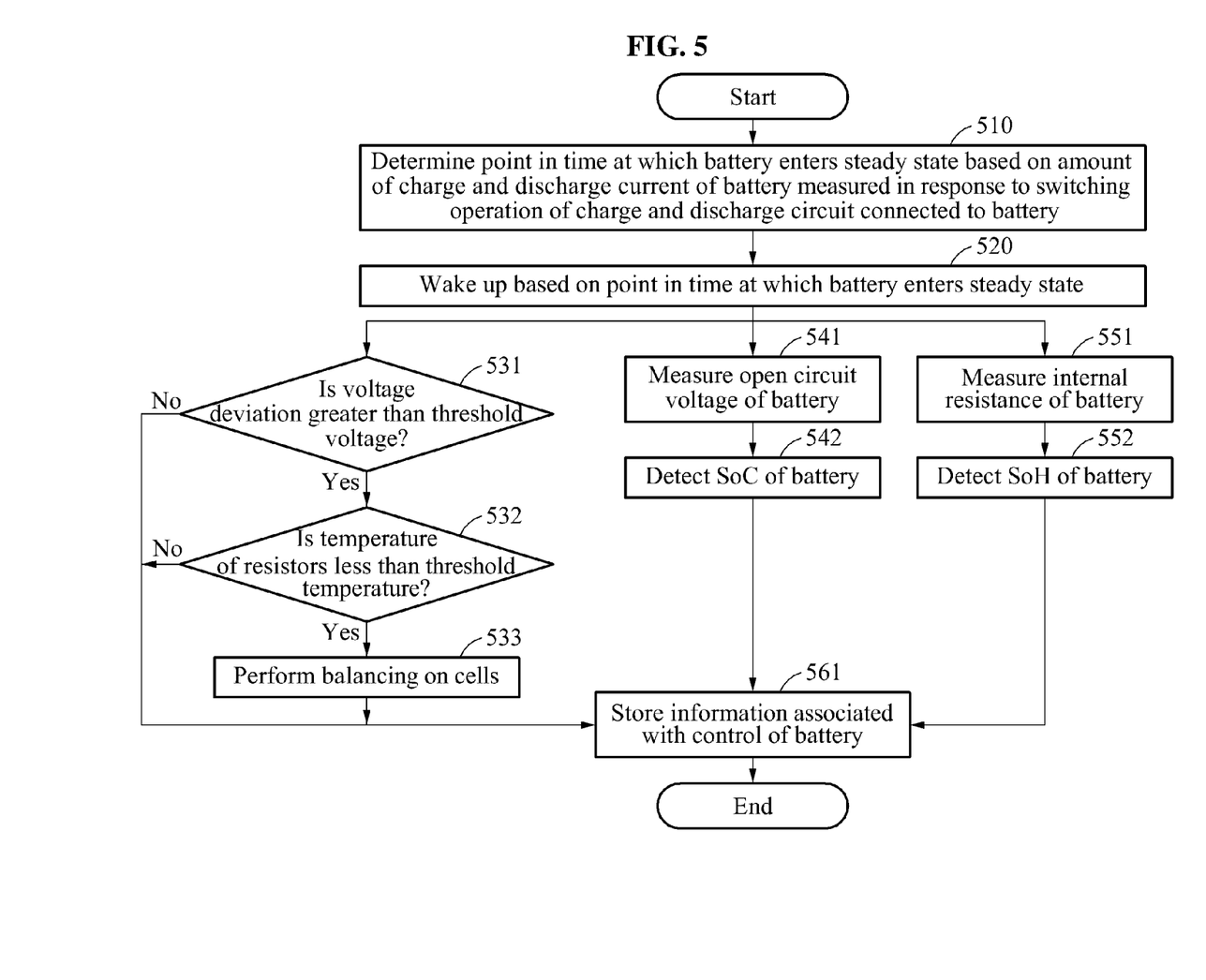
FIG. 5 is a flowchart illustrating another example of an operating method of a battery managing apparatus.

FIG. 5 is a flowchart illustrating another example of an operating method of a battery managing apparatus. Referring to FIG. 5, in operation 510, the battery managing apparatus determines a point in time at which a battery enters a steady state based on an amount of charge and discharge current of the battery measured in response to a switching operation of a charge and discharge circuit connected to the battery. When an ignition key of a driving means to which the battery is provided is turned off, and a switch of the charge and discharge circuit is turned off, charging and discharging of the battery may be suspended, and an operation of the battery managing apparatus may be suspended. The battery managing apparatus may measure the amount of charge and discharge current of the battery at a point in time when the switch of the charge and discharge circuit is turned off or immediately prior to the switch being turned off. The battery managing apparatus may determine the point in time at which the battery enters the steady state by comparing the measured amount of the charge and discharge current to predetermined reference information.

In operation 520, the battery managing apparatus is woken up based on the point in time at which the battery enters the steady state. For example, the battery managing apparatus may set a wakeup cycle based on the point in time at which the battery enters the steady state, and operate based on the set wakeup cycle.

When the battery managing apparatus is being woken up, the battery managing apparatus may perform balancing on cells included in the battery, or detect an SoC or an SoH of the battery.

In an example, in operation 531, the battery managing apparatus extracts a voltage deviation between the cells by measuring voltages of the cells, and determines whether the voltage deviation between the cells is greater than a predetermined threshold voltage. When the voltage deviation is determined to be greater than the predetermined threshold voltage, in operation 532, the battery managing apparatus measures a temperature of resistors connected to the cells, and determines whether the temperature of the resistors is greater than a predetermined threshold temperature. When the temperature of the resistors is determined to be less than the predetermined threshold temperature, in operation 533, the battery managing apparatus performs the balancing on the cells.

In another example, in operation 541, the battery managing apparatus measures an open circuit voltage of the battery. In operation 542, the battery managing apparatus detects the SoC of the battery, using the measured open circuit voltage.

In still another example, in operation 551, the battery managing apparatus measures an internal resistance of the battery. In operation 552, the battery managing apparatus detects the SoH of the battery, using the measured internal resistance.

In operation 561, the battery managing apparatus stores information associated with control of the battery. For example, the battery managing apparatus may store, in a memory included in the battery, information of a result of the balancing performed on the cells, information of the SoC of the battery, and/or information of the SoH of the battery.

Descriptions provided with reference to FIGS. 1 through 4 may be applicable hereto, and thus, repeated descriptions will be omitted for conciseness.

The various units, modules, elements, and methods described above may be implemented using one or more hardware components, one or more software components, or a combination of one or more hardware components and one or more software components.

A hardware component may be, for example, a physical device that physically performs one or more operations, but is not limited thereto. Examples of hardware components include microphones, amplifiers, low-pass filters, high-pass filters, band-pass filters, analog-to-digital converters, digital-to-analog converters, and processing devices.

A software component may be implemented, for example, by a processing device controlled by software or instructions to perform one or more operations, but is not limited thereto. A computer, controller, or other control device may cause the processing device to run the software or execute the instructions. One software component may be implemented by one processing device, or two or more software components may be implemented by one processing device, or one software component may be implemented by two or more processing devices, or two or more software components may be implemented by two or more processing devices.

A processing device may be implemented using one or more general-purpose or special-purpose computers, such as, for example, a processor, a controller and an arithmetic logic unit, a digital signal processor, a microcomputer, a field-programmable array, a programmable logic unit, a microprocessor, or any other device capable of running software or executing instructions. The processing device may run an operating system (OS), and may run one or more software applications that operate under the OS. The processing device may access, store, manipulate, process, and create data when running the software or executing the instructions. For simplicity, the singular term "processing device" may be used in the description, but one of ordinary skill in the art will appreciate that a processing device may include multiple processing elements and multiple types of processing elements. For example, a processing device may include one or more processors, or one or more processors and one or more controllers. In addition, different processing configurations are possible, such as parallel processors or multi-core processors.

A processing device configured to implement a software component to perform an operation A may include a processor programmed to run software or execute instructions to control the processor to perform operation A. In addition, a processing device configured to implement a software component to perform an operation A, an operation B, and an operation C may have various configurations, such as, for example, a processor configured to implement a software component to perform operations A, B, and C; a first processor configured to implement a software component to perform operation A, and a second processor configured to implement a software component to perform operations B and C; a first processor configured to implement a software component to perform operations A and B, and a second processor configured to implement a software component to perform operation C; a first processor configured to implement a software component to perform operation A, a second processor configured to implement a software component to perform operation B, and a third processor configured to implement a software component to perform operation C; a first processor configured to implement a software component to perform operations A, B, and C, and a second processor configured to implement a software component to perform operations A, B, and C, or any other configuration of one or more processors each implementing one or more of operations A, B, and C. Although these examples refer to three operations A, B, C, the number of operations that may implemented is not limited to three, but may be any number of operations required to achieve a desired result or perform a desired task.

Software or instructions for controlling a processing device to implement a software component may include a computer program, a piece of code, an instruction, or some combination thereof, for independently or collectively instructing or configuring the processing device to perform one or more desired operations. The software or instructions may include machine code that may be directly executed by the processing device, such as machine code produced by a compiler, and/or higher-level code that may be executed by the processing device using an interpreter. The software or instructions and any associated data, data files, and data structures may be embodied permanently or temporarily in any type of machine, component, physical or virtual equipment, computer storage medium or device, or a propagated signal wave capable of providing instructions or data to or being interpreted by the processing device. The software or instructions and any associated data, data files, and data structures also may be distributed over network-coupled computer systems so that the software or instructions and any associated data, data files, and data structures are stored and executed in a distributed fashion.

For example, the software or instructions and any associated data, data files, and data structures may be recorded, stored, or fixed in one or more non-transitory computer-readable storage media. A non-transitory computer-readable storage medium may be any data storage device that is capable of storing the software or instructions and any associated data, data files, and data structures so that they can be read by a computer system or processing device. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, or any other non-transitory computer-readable storage medium known to one of ordinary skill in the art.

Functional programs, codes, and code segments for implementing the examples disclosed herein can be easily constructed by a programmer skilled in the art to which the examples pertain based on the drawings and their corresponding descriptions as provided herein.

As a non-exhaustive illustration only, a terminal or device described herein may refer to mobile devices such as a cellular phone, a personal digital assistant (PDA), a digital camera, a portable game console, and an MP3 player, a portable/personal multimedia player (PMP), a handheld e-book, a portable laptop PC, a global positioning system (GPS) navigation, a tablet, a sensor, and devices such as a desktop PC, a high definition television (HDTV), an optical disc player, a setup box, a home appliance, and the like that are capable of wireless communication or network communication consistent with that which is disclosed herein.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A battery managing apparatus, comprising:
   a battery controller configured to:
      calculate a time when a battery enters a steady state based on a measured charge and discharge current of the battery;
      set a wakeup cycle on a time controller based on the calculated time when the battery enters the steady state;
      receive a wakeup signal from the time controller based on the calculated time when the battery enters the steady state; and
      control the battery based on the wakeup signal.

2. The apparatus of claim 1, wherein the battery controller is further configured to:
   measure the charge and discharge current of the battery at a time when a switch of a charge and discharge circuit is turned off or immediately prior to the switch being turned off.

3. The apparatus of claim 1, wherein the battery controller is configured to:
   perform the calculation of the time when the battery enters the steady state by comparing the measured charge and discharge current to predetermined reference information.

4. The apparatus of claim 1, further comprising:
   a driving power supplier configured to supply driving power to the battery controller,
   wherein the time controller is configured to wake up the battery controller by transmitting a wakeup signal to the driving power supplier.

5. The apparatus of claim 4, wherein the driving power supplier is configured to:
   supply the driving power to the battery controller in response to receiving the wakeup signal.

6. The apparatus of claim 1, wherein:
   the time controller is configured to wake up the battery controller based on the wakeup cycle.

7. The apparatus of claim 1, further comprising:
   a balancing unit configured to measure voltages of cells comprised in the battery, and perform balancing on the cells.

8. The apparatus of claim 7, wherein the battery controller is further configured to:

calculate a voltage deviation between the cells based on the voltages; and control the balancing unit to perform the balancing on the cells.

9. The apparatus of claim 7, wherein:

the balancing unit comprises resistors connected respectively to the cells; and the battery controller is further configured to control the balancing unit to apply power of remaining cells, excluding a cell having a lowest voltage among the cells, to resistors connected respectively to the remaining cells to allow respective voltages of the remaining cells to be a voltage of the cell having the lowest voltage.

10. The apparatus of claim 7, wherein:

the balancing unit comprises a temperature measurer configured to measure a temperature of resistors; and the battery controller is further configured to control the balancing unit to perform the balancing on the cells.

11. The apparatus of claim 1, wherein the battery controller is further configured to:

detect a state of charge of the battery in response to the time controller waking up the battery controller.

12. The apparatus of claim 11, further comprising:

a voltage measurer configured to measure an open circuit voltage of the battery, wherein the battery controller is configured to detect the state of charge of the battery based on the measured open circuit voltage.

13. The apparatus of claim 1, wherein the battery controller is further configured to:

detect a state of health of the battery in response to the time controller waking up the battery controller.

14. The apparatus of claim 13, further comprising:

a resistance measurer configured to measure an internal resistance of the battery, wherein the battery controller is configured to detect the state of health of the battery based on the measured internal resistance.

15. The apparatus of claim 1, wherein the battery controller is further configured to:

store information of the control of the battery.

16. The apparatus of claim 1, wherein the battery controller is further configured to calculate the time based on a lookup table mapping a point in time when the battery enters the steady state to the measured charge and discharge current.

17. The apparatus of claim 1, wherein the battery controller is further configured to perform a balancing on cells of the battery when a voltage deviation between the cells is greater than a predetermined threshold voltage.

* * * * *